(12) United States Patent
Chen et al.

(10) Patent No.: US 11,502,032 B2
(45) Date of Patent: Nov. 15, 2022

(54) CHIP PACKAGE AND METHOD OF FABRICATING THE SAME

(71) Applicant: Taiwan Semiconductor Manufacturing Company, Ltd., Hsinchu (TW)

(72) Inventors: Guan-Yu Chen, Hsinchu (TW); An-Jhih Su, Taoyuan (TW); Der-Chyang Yeh, Hsin-Chu (TW); Li-Hsien Huang, Hsinchu County (TW); Ming-Shih Yeh, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 3 days.

(21) Appl. No.: 17/128,194

(22) Filed: Dec. 21, 2020

(65) Prior Publication Data

US 2021/0111120 A1 Apr. 15, 2021

Related U.S. Application Data

(62) Division of application No. 16/258,672, filed on Jan. 28, 2019, now Pat. No. 10,872,855.
(Continued)

(51) Int. Cl.
*H01L 23/522* (2006.01)
*H01L 23/00* (2006.01)
(Continued)

(52) U.S. Cl.
CPC ........ *H01L 23/5226* (2013.01); *H01L 21/561* (2013.01); *H01L 21/563* (2013.01);
(Continued)

(58) Field of Classification Search
CPC ... H01L 23/5226; H01L 25/50; H01L 25/105; H01L 21/822; H01L 21/563;
(Continued)

(56) References Cited

U.S. PATENT DOCUMENTS 7,005,319 B1 * 2/2006 Chen ..................... H01L 24/83
438/114
9,000,584 B2 4/2015 Lin et al.
(Continued)

*Primary Examiner* — Nicholas J Tobergte
(74) *Attorney, Agent, or Firm* — JCIPRNET

(57) ABSTRACT

A chip package including an integrated circuit component, a thermal conductive layer, an insulating encapsulant and a redistribution circuit structure is provided. The integrated circuit component includes an amorphous semiconductor portion located at a back surface thereof. The thermal conductive layer covers the amorphous semiconductor portion of the integrated circuit component, wherein thermal conductivity of the thermal conductive layer is greater than or substantially equal to 10 W/mK. The insulating encapsulant laterally encapsulates the integrated circuit component and the thermal conductive layer. The redistribution circuit structure is disposed on the insulating encapsulant and the integrated circuit component, wherein the redistribution circuit structure is electrically connected to the integrated circuit component.

20 Claims, 13 Drawing Sheets

Related U.S. Application Data

(60) Provisional application No. 62/691,624, filed on Jun. 29, 2018.

(51) Int. Cl.
  *H01L 23/42* (2006.01)
  *H01L 23/31* (2006.01)
  *H01L 21/56* (2006.01)
  *H01L 21/822* (2006.01)
  *H01L 25/10* (2006.01)
  *H01L 25/00* (2006.01)

(52) U.S. Cl.
  CPC ........ *H01L 21/822* (2013.01); *H01L 23/3135* (2013.01); *H01L 23/42* (2013.01); *H01L 24/09* (2013.01); *H01L 24/14* (2013.01); *H01L 24/17* (2013.01); *H01L 24/32* (2013.01); *H01L 24/73* (2013.01); *H01L 24/97* (2013.01); *H01L 25/105* (2013.01); *H01L 25/50* (2013.01); *H01L 2224/0231* (2013.01); *H01L 2224/02373* (2013.01); *H01L 2224/02379* (2013.01); *H01L 2224/73257* (2013.01)

(58) Field of Classification Search
  CPC ....... H01L 21/561; H01L 24/73; H01L 24/32; H01L 2224/0231; H01L 21/6835
  See application file for complete search history.

(56) References Cited

U.S. PATENT DOCUMENTS

| | | | |
|---|---|---|---|
| 9,048,222 B2 * | 6/2015 | Hung | H01L 25/50 |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2008/0202386 A1* | 8/2008 | Hougham | H01L 23/3736 257/E23.11 |
| 2010/0012934 A1* | 1/2010 | Jung | H01L 24/06 257/737 |
| 2011/0215450 A1* | 9/2011 | Chi | H01L 24/97 438/126 |
| 2012/0001328 A1* | 1/2012 | Chang | H01L 24/96 257/738 |
| 2012/0080784 A1* | 4/2012 | Kadakia | H01L 23/4338 257/E23.181 |
| 2014/0287239 A1* | 9/2014 | Scurati | H01L 24/32 264/261 |
| 2015/0145149 A1* | 5/2015 | Wachter | H01L 23/3114 257/787 |
| 2020/0161284 A1* | 5/2020 | Iida | G02B 6/4214 |

* cited by examiner

CHIP PACKAGE AND METHOD OF FABRICATING THE SAME

CROSS-REFERENCE TO RELATED APPLICATION

This application is a divisional application of U.S. application Ser. No. 16/258,672, filed on Jan. 28, 2019, which claims the priority benefit of U.S. provisional application Ser. No. 62/691,624, filed on Jun. 29, 2018. The entirety of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. Heat generated from the integrated circuit component(s) of the integrated fan-out packages is not effectively dissipated due to low thermal conductivity (e.g., k<1 W/mK) of the die attachment film.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
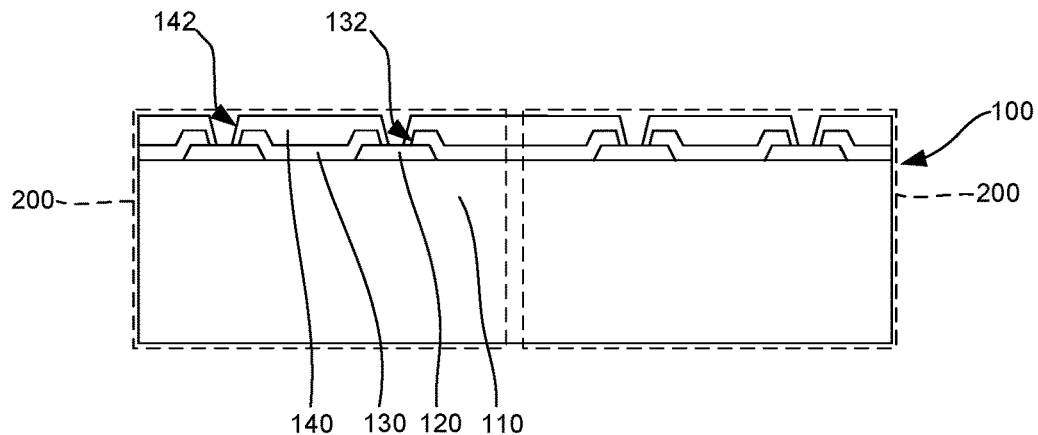
FIGS. 1 through 15 illustrate a process flow for fabricating an integrated fan-out package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1 through 15 illustrate a process flow for fabricating an integrated fan-out package in accordance with some embodiments of the present disclosure.

Referring to FIG. 1, a wafer 100 including a plurality of semiconductor dies or integrated circuit components 200 arranged in an array is provided. Before a wafer dicing process is performed on the wafer 100, the integrated circuit components 200 of the wafer 100 are connected one another. In some embodiments, the wafer 100 may include a semiconductor substrate 110, a plurality of conductive pads 120 formed on the semiconductor substrate 110, and a passivation layer 130. The passivation layer 130 is formed over the substrate 110 and has a plurality of contact openings 132 such that the conductive pads 120 are partially revealed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1, in some embodiments, the wafer 100 may further include a post-passivation layer 140 formed on the passivation layer 130. The post-passivation layer 140 covers the passivation layer 130 and has a plurality of contact openings 142. The conductive pads 120 revealed by the contact openings 132 of the passivation 130 are partially revealed by the contact openings 142 of the post passivation layer 140. For example, the post-passivation layer 140 may be a polyimide (PI) layer, a polybenzoxazole (PBO) layer, or a dielectric layer formed by other suitable polymers.

Figure 2:
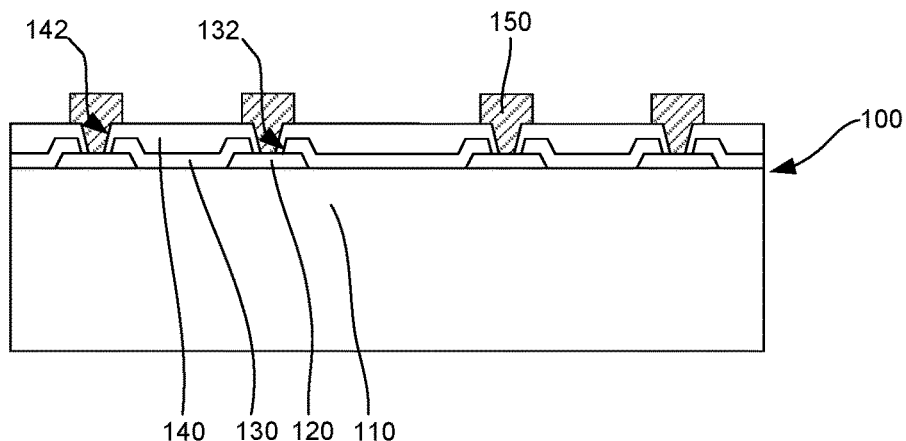

Referring to FIG. 2, a plurality of conductive pillars 150 are formed on the conductive pads 120. In some embodiments, the conductive pillars 150 are plated on the conductive pads 120. The plating process of conductive pillars 150 is described in detail as followings. First, a seed layer may be sputtered onto the post-passivation layer 140 and the conductive pads 120 revealed by the contact openings 142. A patterned photoresist layer (not shown) may be then formed over the seed layer by photolithography, wherein the patterned photoresist layer reveals portions of the seed layer that are corresponding to the conductive pads 120. The wafer 100 including the patterned photoresist layer formed thereon may be immersed into a plating solution in a plating bath such that the conductive pillars 150 are plated on the portions of the seed layer that are corresponding to the conductive pads 120. After forming the plated conductive pillars 150, the patterned photoresist layer is stripped. Thereafter, by using the conductive pillars 150 as a hard mask, portions of the seed layer that are not covered by the conductive pillars 150 may be removed through etching until the post passivation layer 140 is revealed, for example. In some embodiments, the plated conductive pillars 150 may be plated copper pillars.

Figure 3:
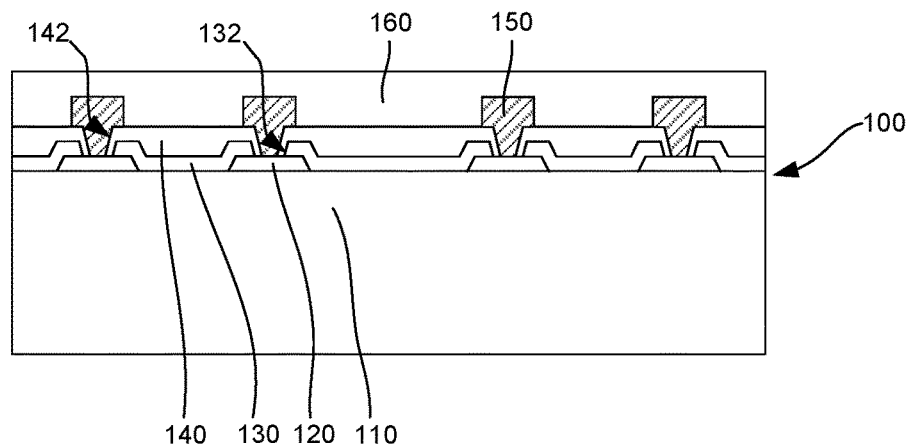

Referring to FIG. 3, after the conductive pillars 150 are formed, a protection layer 160 is formed on the post passivation layer 140 so as to cover the conductive pillars 150. In some embodiments, the protection layer 160 may be a polymer layer having sufficient thickness to encapsulate and protect the conductive pillars 150. For example, the protection layer 160 may be a polybenzoxazole (PBO) layer, a polyimide (PI) layer or other suitable polymers. In some alternative embodiments, the protection layer 160 may be made of inorganic materials.

Figure 4:
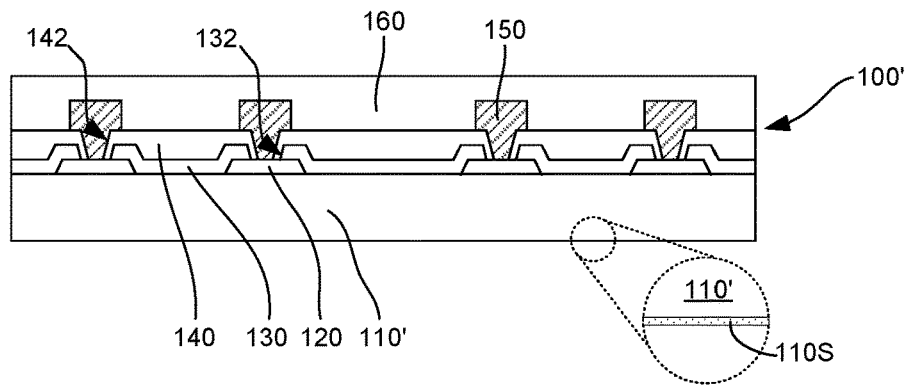

Referring to FIG. 3 and FIG. 4, a back-side grinding process is performed on the back surface of the wafer 100 after forming the protection layer 160. During the back-side grinding process, the semiconductor substrate 110 is ground by a grinding wheel such that a thinned wafer 100' including a thinned semiconductor substrate 110', the conductive pads 120 formed on the semiconductor substrate 110', the passivation layer 130, the post passivation layer 140, the conductive pillars 150 and the protection layer 160 is formed. After performing the back-side grinding process, as shown in FIG. 4, an amorphous semiconductor portion 110S (e.g., amorphous silicon layer) resulted from the back-side grinding process is formed at the back surface of the semiconductor substrate 110'. In some embodiments, the thickness of the amorphous semiconductor portion 110S may range from about 10 nanometers to about 50 nanometers. Furthermore, the grit size of the grinding wheel for grinding of the semiconductor substrate 110 may range from about 3 micrometers to about 15 micrometers.

Figure 5:
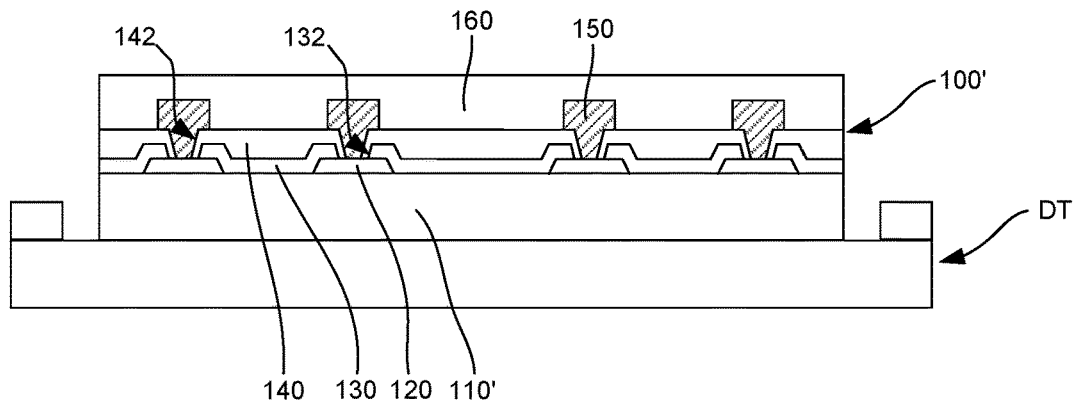

Referring to FIG. 5, after performing the back-side grinding process, the thinned wafer 100' is mounted on a dicing tape DT such that the back surface of the thinned semiconductor substrate 110' is adhered with the dicing tape DT. In some embodiments, the dicing tape DT may support the thinned wafer 100' mounted thereon and temporarily adhere with the back surface of the thinned wafer 100'.

Figure 6:
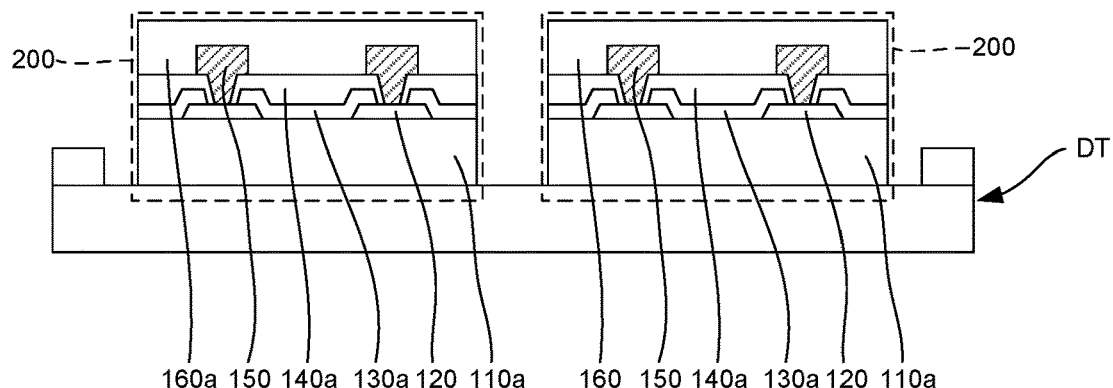

Referring to FIG. 5 and FIG. 6, after mounting the thinned wafer 100' on the dicing tape DT, a wafer dicing process is performed on the thinned wafer 100' such that the integrated circuit components 200 in the wafer 100' are singulated from one another. After the singulation process, a plurality of singulated integrated circuit components 200 adhered with the dicing tape DT are formed. As shown in FIG. 6, each of the singulated integrated circuit components 200 includes a semiconductor substrate 110a, the conductive pads 120 formed on the semiconductor substrate 110a, a passivation layer 130a, a post passivation layer 140a, the conductive pillars 150, and a protection layer 160a. The materials and the characteristics of the semiconductor substrate 110a, the passivation layer 130a, the post passivation layer 140a, and the protection layer 160a are the same as those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a in the singulated integrated circuit components 200 are omitted.

During the back-side grinding and the wafer dicing processes, the protection layer 160 may well protect the conductive pillars 150 of the integrated circuit components 200. In addition, the conductive pillars 150 of the singulated integrated circuit components 200 may be protected from being damaged by subsequently performed processes, such as the picking-up and placing process of the singulated integrated circuit components 200, the molding process, and so on.

Figure 7:
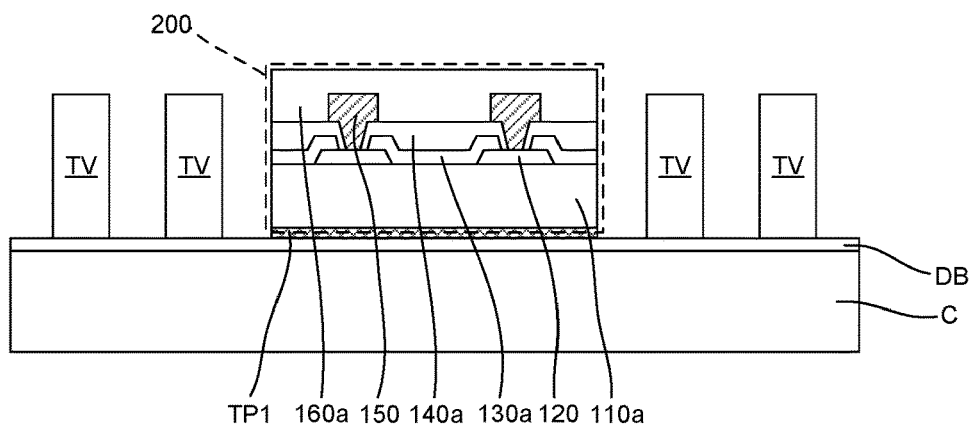

Referring to FIG. 6 and FIG. 7, a carrier C having a de-bonding layer DB formed thereon is provided. In some embodiments, the carrier C is a glass substrate and the de-bonding layer DB is a light-to-heat conversion (LTHC) release layer formed on the glass substrate. In some alternative embodiments, a dielectric layer (not shown) may be formed on the de-bonding layer DB such that the de-bonding layer DB is between the carrier C and the dielectric layer. The dielectric layer is a polybenzoxazole (PBO) layer formed on the de-bonding layer DB, for example.

After the carrier C having the de-bonding layer DB formed thereon is provided, a plurality of conductive through vias TV are formed on the de-bonding layer DB. In some embodiments, the plurality of conductive through vias TV may be formed by sputtering of a seed layer, photoresist coating, photolithography, plating of through vias, photoresist stripping and patterning of the seed layer. For example, the conductive through vias TV include copper posts or other suitable metal posts.

As shown in FIG. 6 and FIG. 7, in some embodiments, one of the singulated integrated circuit components 200 including the semiconductor substrate 110a, the conductive pads 120, the passivation layer 130a, the post passivation layer 140a, the conductive pillars 150, and the protection layer 160a is picked-up from the dicing tape DT and placed on the de-bonding layer DB. In some alternative embodiments, more than one of the singulated integrated circuit components 200 are picked-up from the dicing tape DT and placed on the de-bonding layer DB, wherein the singulated integrated circuit components 200 placed on the de-bonding layer DB may be arranged in an array. When the singulated integrated circuit components 200 placed on the de-bonding layer DB are arranged in an array, the conductive through vias TV may be classified into groups and the number of the singulated integrated circuit components 200 is corresponding to the number of the groups of the conductive through vias TV.

The singulated integrated circuit components 200 is attached or adhered on the de-bonding layer DB through a first thermal paste TP1, wherein the thermal conductivity (k) of the first thermal paste TP1 is greater than or substantially equal to 10 W/mK. In some embodiments, the first thermal paste TP1 may be formed on the de-bonding layer DB through dispensing or other suitable processes. For example, the thermal conductivity (k) of the first thermal paste TP1 may range from about 10 W/mK to about 250 W/mK. In addition, the material of the first thermal paste TP1 may be polymer paste containing metal powder.

As shown in FIG. 7, the top surface of the protection layer 160a is higher than the top surfaces of the conductive through vias TV while the top surface of the protection layer 160a is higher than the top surfaces of the conductive pillars 150, for example. However, the disclosure is not limited thereto. In some alternative embodiments, the top surface of the protection layer 160a may be substantially aligned with the top surfaces of the conductive through vias TV, and the top surface of the protection layer 160a is higher than the top surfaces of the conductive pillars 150.

Figure 8:
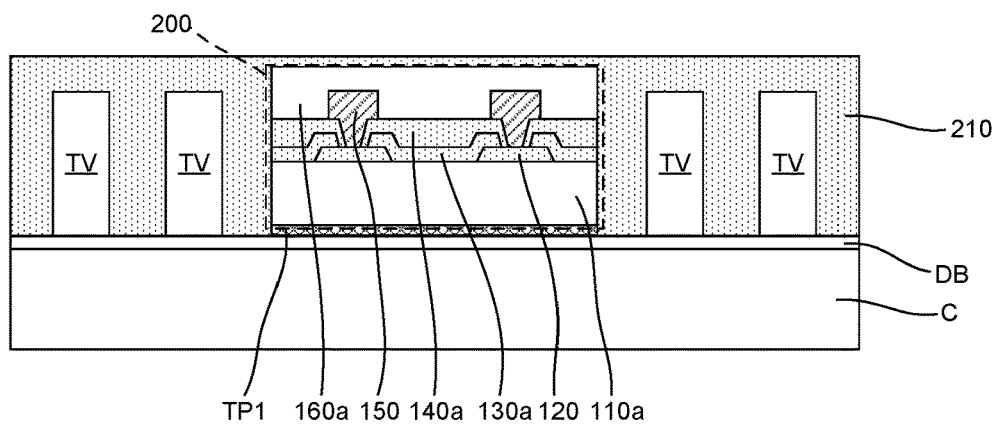

Referring to FIG. 8, an insulating material 210 is formed on the de-bonding layer DB to cover the singulated integrated circuit component 200 and the conductive through vias TV. In some embodiments, the insulating material 210 is a molding compound formed by a molding process. The top surface of the protection layer 160a of the singulated integrated circuit component 200 are covered by the insulating material 210, for example. In other words, the top surface of the protection layer 160a of the singulated integrated circuit component 200 are not revealed and are protected by the insulating material 210. In some embodiments, the insulating material 210 includes epoxy or other suitable dielectric materials.

Figure 9:
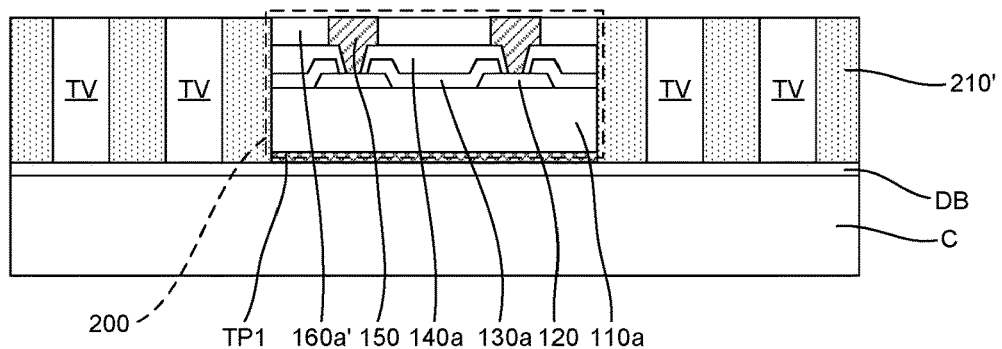

Referring to FIG. 8 and FIG. 9, the insulating material 210 is ground until the top surfaces of the conductive pillars 150, the top surfaces of the conductive through vias TV and the top surface of the protection layer 160a are revealed. In some embodiments, the insulating material 210 is ground by a mechanical grinding process and/or a chemical mechanical polishing (CMP) process. After the insulating material 210 is ground, an insulating encapsulation 210' is formed. During the grinding process of the insulating material 210, portions of the protection layer 160a are ground to form a protection layer 160a'. In some embodiments, during the grinding process of the insulating material 210 and the protection layer 160a, portions of the conductive through vias TV and portions of the conductive pillars 150 are slightly ground also.

As shown in FIG. 9, the insulating encapsulation 210' laterally encapsulates the sidewalls of the singulated integrated circuit component 200, and the insulating encapsulation 210' is penetrated by the conductive through vias TV. In other words, the singulated integrated circuit component 200 and the conductive through vias TV are embedded in the insulating encapsulation 210'. It is noted that the top surfaces of the conductive through vias TV, the top surface of the insulating encapsulation 210', the top surfaces of the conductive pillars 150 and the top surface of the protection layer 160a' are substantially at the same level.

Figure 10:
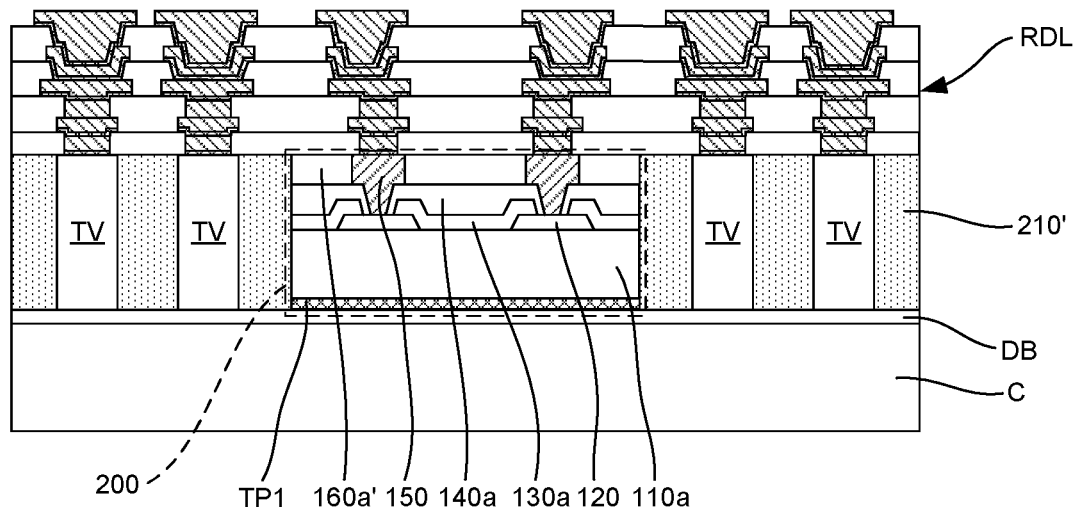

Referring to FIG. 10, after forming the insulating encapsulation 210' and the protection layer 160a', a redistribution circuit structure RDL is formed on the top surfaces of the conductive through vias TV, the top surface of the insulating encapsulation 210', the top surfaces of the conductive pillars 150 and the top surface of the protection layer 160a'. The redistribution circuit structure RDL is fabricated to electrically connect with one or more connectors underneath. Here, the afore-said connectors may be the conductive pillars 150 of the singulated integrated circuit component 200 and/or the conductive through vias TV embedded in the insulating encapsulation 210'. The redistribution circuit structure RDL may include a plurality of redistribution wirings and a plurality of patterned dielectric layers stacked alternately, as shown in FIG. 10. For example, the redistribution wirings may be copper wirings and the material of the patterned dielectric layers may include polyimide (PI), polybenzoxazole (PBO) or other suitable dielectric polymer. Furthermore, the conductive through vias TV are electrically connected to the singulated integrated circuit component 200 through the redistribution circuit structure RDL.

Figure 11:
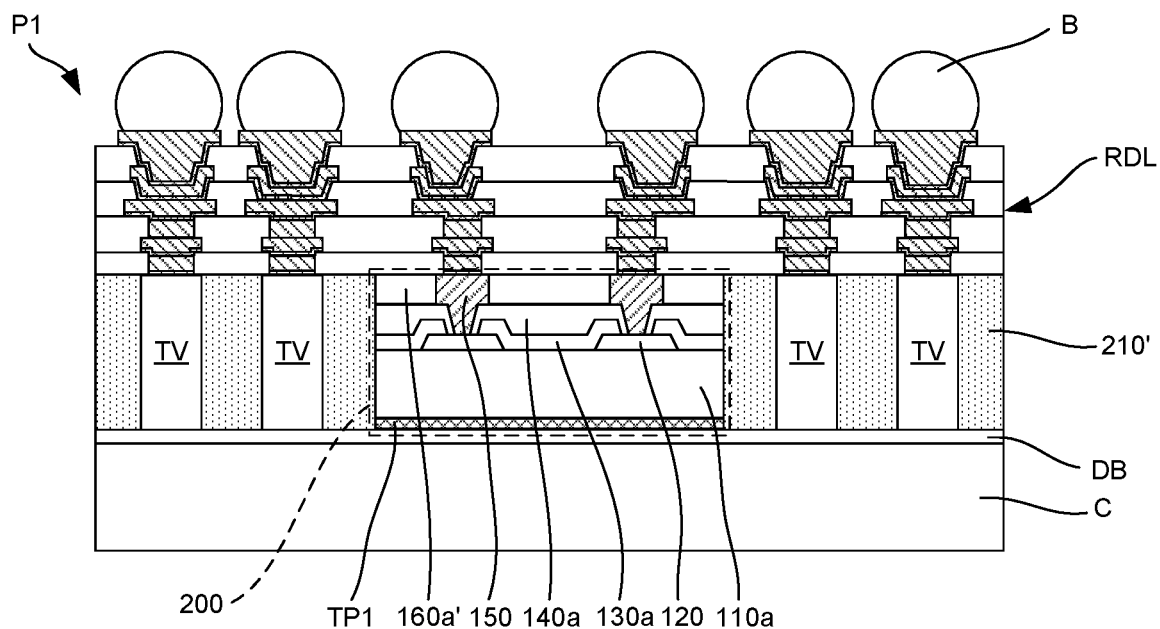

Referring to FIG. 11, after forming the redistribution circuit structure RDL, a plurality of conductive features B electrically connected to the redistribution circuit structure RDL are formed. The conductive features B are disposed on the redistribution circuit structure RDL and are arranged in array. In some embodiments, the conductive features B may be conductive balls (e.g., solder balls) arranged in array. As shown in FIG. 11, a package structure P1 including the first thermal paste TP1, the singulated integrated circuit component 200, the conductive through vias TV, the insulating encapsulation 210', the redistribution circuit structure RDL and the conductive features B is fabricated on the de-bonding layer DB carried by the carrier C.

Figure 12:
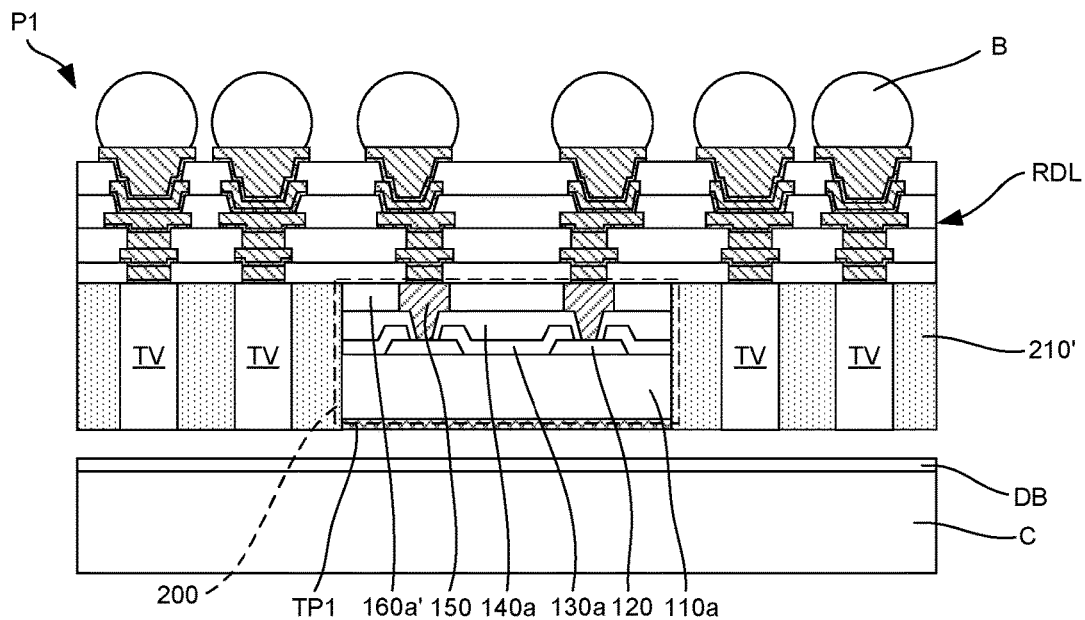

Referring to FIG. 12, the de-bonding layer DB and the carrier C are be-bonded from the package structure P1 such that the bottom surfaces of the conductive through vias TV, the bottom surface of the insulating encapsulation 210' and a surface of the first thermal paste TP1 are de-bonded from the carrier C and are revealed. The bottom surface of the insulating encapsulation 210' and the revealed surface of the first thermal paste TP1 are substantially at the same level. In some embodiments, the external energy such as UV laser, visible light or heat, may be applied to the de-bonding layer DB such that the package structure P1 and the de-bonding layer DB carried by the carrier C can be separated.

Figure 13:
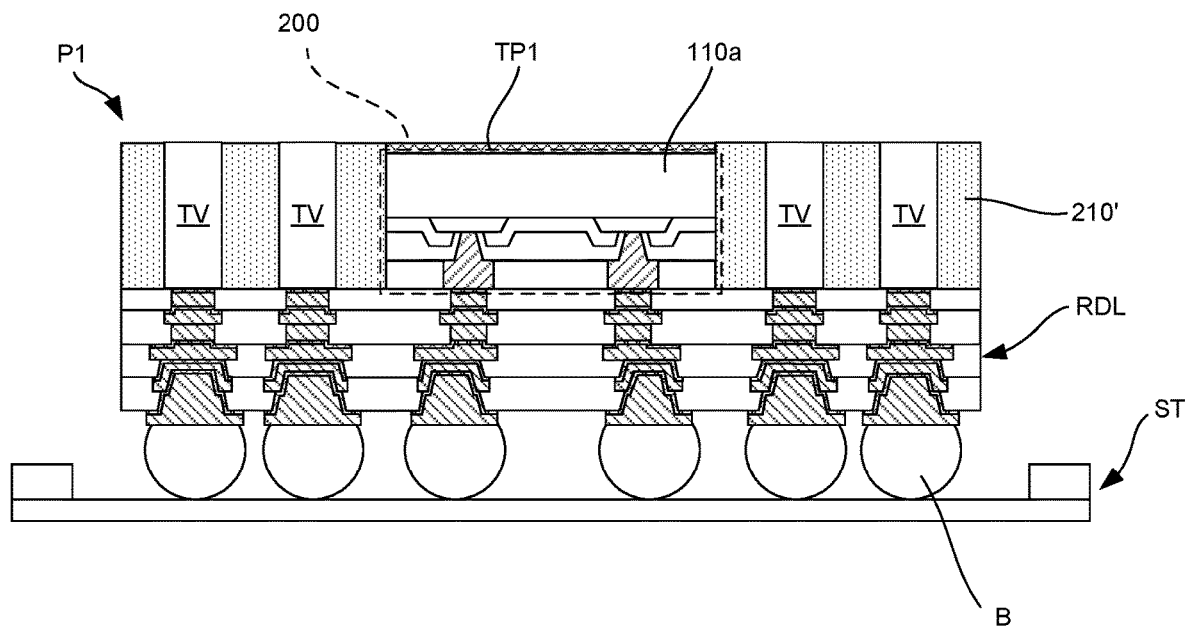

Referring to FIG. 13, after performing the de-bonding process, the package structure P1 may be flipped (turned upside down) and mounted onto a saw tape ST such that the conductive features B of the package structure P1 are adhered with the saw tape ST. In some embodiments, the saw tape ST may support the above-mentioned package structure P1 mounted thereon and temporarily adhere with the conductive features B of the package structure P1. Since the thermal conductivity (k) of the first thermal paste TP1 is high (i.e. greater than or substantially equal to 10 W/mK), the first thermal paste TP1 can effectively conduct and dissipate the heat generated from the singulated integrated circuit components 200. Accordingly, the first thermal paste TP1 may be not needed to be removed to enhance the heat dissipation performance of the package structure P1.

Figure 14:
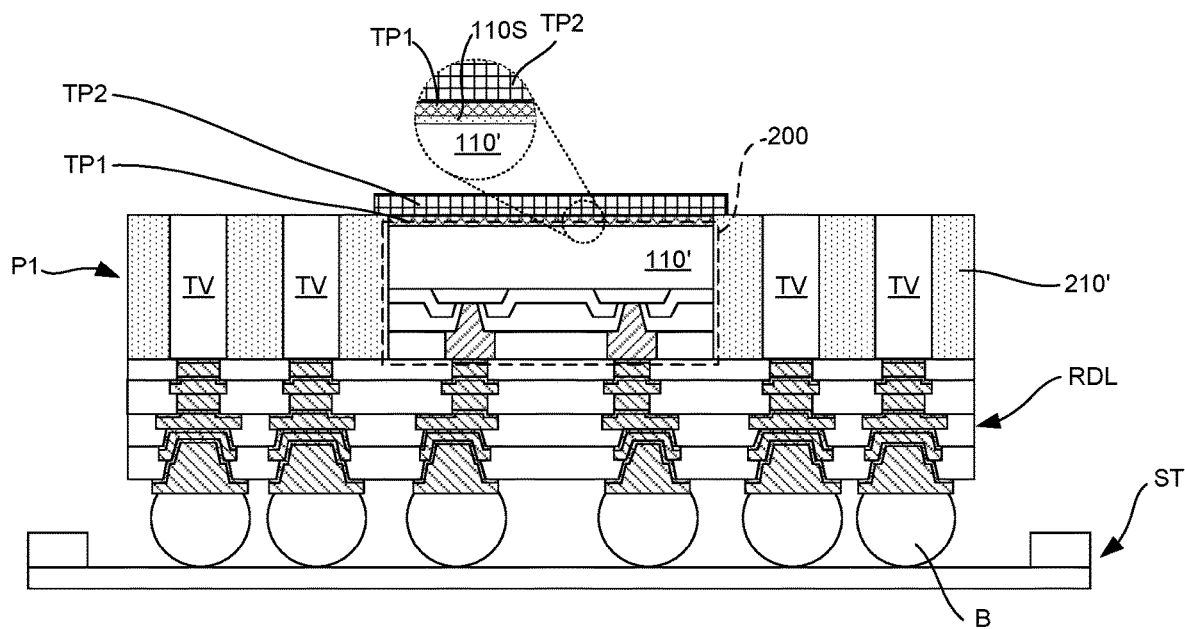

Referring to FIG. 14, a second thermal paste TP2 may be formed to cover the revealed surface of the first thermal paste TP1, wherein the thermal conductivity (k) of the second thermal paste TP2 is greater than or substantially equal to 10 W/mK. For example, the thermal conductivity (k) of the second thermal paste TP2 may range from about 10 W/mK to about 250 W/mK. In some embodiments, the thermal conductivity (k) of the first thermal paste TP1 may be substantially equal to the thermal conductivity (k) of the second thermal paste TP2. In some alternative embodiments, the thermal conductivity (k) of the first thermal paste TP1 may be greater than or less than to the thermal conductivity (k) of the second thermal paste TP2. Since the thermal conductivity (k) of both the first thermal paste TP1 and the second thermal paste TP2 is high (i.e. greater than or substantially equal to 10 W/mK), the first thermal paste TP1 and the second thermal paste TP2 can effectively conduct and dissipate the heat generated from the singulated integrated circuit components 200.

As shown in FIG. 14, the first thermal paste TP1 is embedded in the insulating encapsulation 210' and the first thermal paste TP1 is in contact with the amorphous semiconductor portion 110S of the thinned semiconductor substrate 110'. In some embodiments, the second thermal paste TP2 may be thicker than the first thermal paste TP1. In some alternative embodiments, the second thermal paste TP2 may be thinner than the first thermal paste TP1. In some other embodiments, the first thermal paste TP1 and the second thermal paste TP2 may be substantial identical in thickness. For example, the thickness of the first thermal paste TP1 may range from about 1 micrometer to about 100 micrometers while the thickness of the second thermal paste TP2 may range from about 1 micrometer to about 100 micrometers. Furthermore, the second thermal paste TP2 may not only cover the surface of the first thermal paste TP1, but also may partially cover the surface of the insulating encapsulation 210'. However, the distribution of the second thermal paste TP2 is not limited thereto.

When at least one of the first thermal paste TP1 and the second thermal paste TP2 contains metallic particles (e.g., copper particles), the amorphous semiconductor portion 110S of the thinned semiconductor substrate 110' may trap the metallic particles contained in the first thermal paste TP1 and/or the second thermal paste TP2. In other words, when at least one of the first thermal paste TP1 and the second thermal paste TP2 contains metallic particles, the amorphous semiconductor portion 110S of the thinned semiconductor substrate 110' may serve as a diffusion barrier for metallic particles. Accordingly, the package structure P1 may easily qualify the high temperature operating life (HTOL) test.

Figure 31:
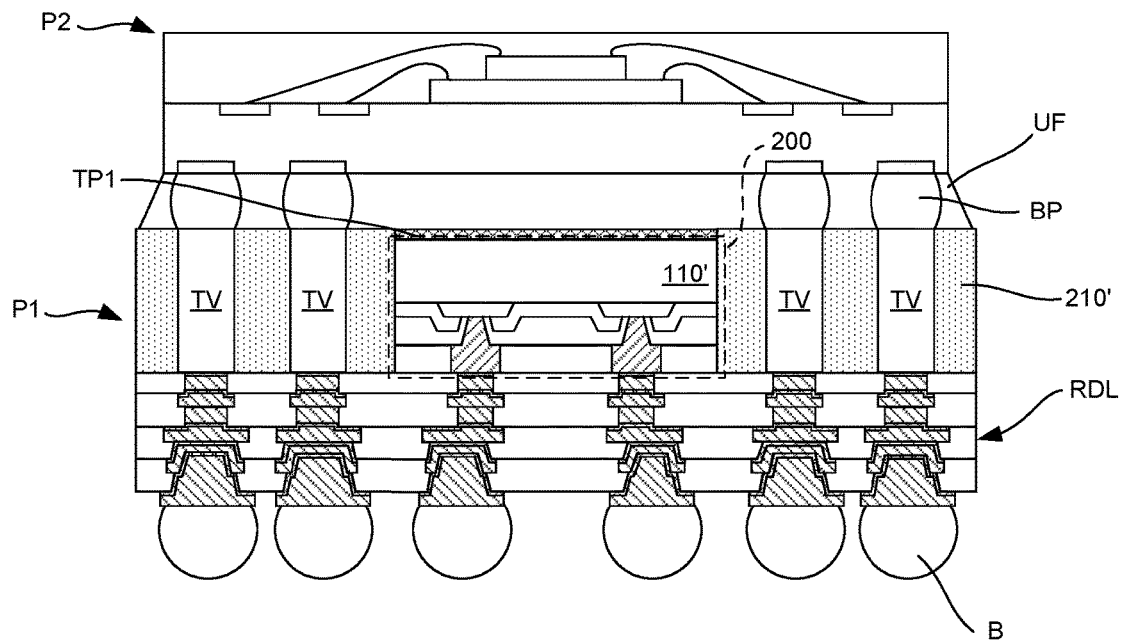
FIG. 31 schematically illustrates an integrated fan-out package in accordance with some embodiments of the present disclosure.

In some alternative embodiments, the fabrication of the second thermal paste TP2 may be omitted, as shown in FIG. 31.

As shown in FIG. 14, the combination of the first thermal paste TP1 and the second thermal paste TP2 may be considered as a thermal conductive layer which covers the amorphous semiconductor portion 110S of the singulated integrated circuit component 200. In some alternative embodiments, the thermal conductive layer includes the first thermal paste TP1 only when the fabrication of the second thermal paste TP2 is omitted.

Figure 15:
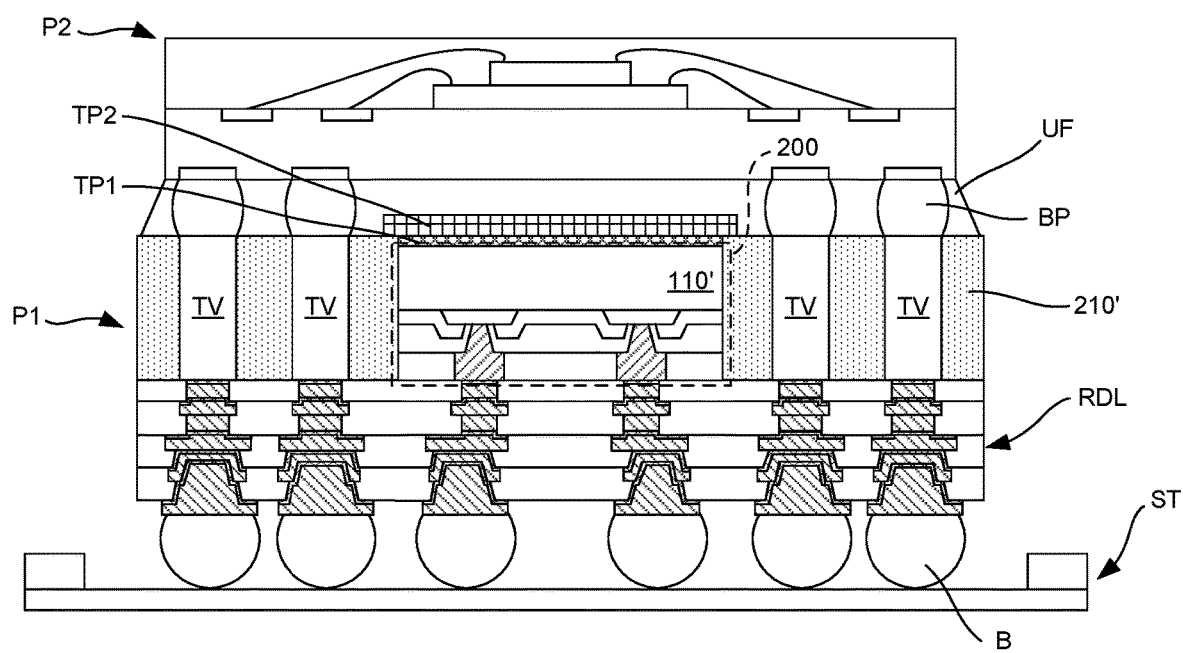

Referring to FIG. 15, a semiconductor device P2 is provided and is placed on the package structure P1 so as to electrically connect the semiconductor device P2 to the conductive through vias TV. The semiconductor device P2 is electrically connected to the integrated circuit component 200 through the conductive through vias TV and the redistribution circuit structure RDL. In some embodiments, the semiconductor device P2 may be electrically connected to the conductive through vias TV of the package structure P1 through a plurality of conductive bumps BP. For example, the conductive bumps BP may be micro-bumps, controlled collapse chip connection (C4) bumps or the like.

In some embodiments, the semiconductor device P2 may be a memory device (e.g., DRAM) including the conductive bumps BP on the bottom surface thereof. For example, the semiconductor device P2 is a ball grid array (BGA) type package. In the semiconductor device P2, at least one memory chip may be mounted on a BGA circuit board, electrically connected to the BGA board through bonding wires, and encapsulated by a molding compound. Before mounting the semiconductor device P2 onto the package structure P1, solder material may be applied onto the conductive through vias TV of the package structure P1 through, for example, a stencil printing process, and then the semiconductor device P2 including the conductive bumps BP is placed on the conductive through vias TV. Thereafter, a reflow process is performed to form solder joints between the semiconductor device P2 and the conductive through vias TV of the package structure P1.

After performing the above-mentioned reflow process, an underfill UF is formed between the package structure P1 and the semiconductor device P2 to encapsulate the second thermal paste TP2 and the conductive bumps BP. In some embodiments, the material of the underfill UF may include epoxy resin containing filler and the thermal conductivity of the underfill UF may be less than about 1 W/mK. The underfill UF laterally encapsulates the conductive bumps BP and serves as stress buffer to minimize fatigue of the conductive bumps BP due to coefficient of thermal expansion (CTE) mismatch between the package structure P1 and the semiconductor device P2.

After forming the underfill UF, a sawing process is performed on the package structure P1 to form a plurality of singulated package-on-package (PoP) structures. After performing the sawing process of the package structure P1, the singulated package-on-package (PoP) structures are adhered with the saw tape ST. Furthermore, the underfill UF may ensure the reliability of the package-on-package (PoP) structure including the package structure P1 and the semiconductor device P2.

FIGS. 16 through 30 illustrate a process flow for fabricating an integrated fan-out package in accordance with some alternative embodiments of the present disclosure.

Figure 16:
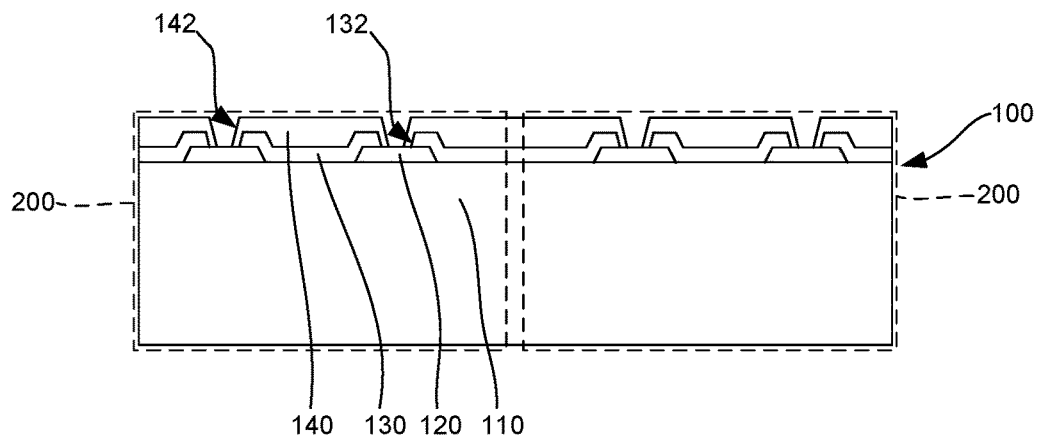
FIGS. 16 through 30 illustrate a process flow for fabricating an integrated fan-out package in accordance with some alternative embodiments of the present disclosure.

Referring to FIG. 16, a wafer 100 including a plurality of semiconductor dies or integrated circuit components 200 arranged in an array is provided. Before a wafer dicing process is performed on the wafer 100, the integrated circuit components 200 of the wafer 100 are connected one another. In some embodiments, the wafer 100 may include a semiconductor substrate 110, a plurality of conductive pads 120 formed on the semiconductor substrate 110, and a passivation layer 130. The passivation layer 130 is formed over the substrate 110 and has a plurality of contact openings 132 such that the conductive pads 120 are partially revealed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 16, in some embodiments, the wafer 100 may further include a post-passivation layer 140 formed on the passivation layer 130. The post-passivation layer 140 covers the passivation layer 130 and has a plurality of contact openings 142. The conductive pads 120 revealed by the contact openings 132 of the passivation 130 are partially revealed by the contact openings 142 of the post passivation layer 140. For example, the post-passivation layer 140 may be a polyimide (PI) layer, a polybenzoxazole (PBO) layer, or a dielectric layer formed by other suitable polymers.

Figure 17:
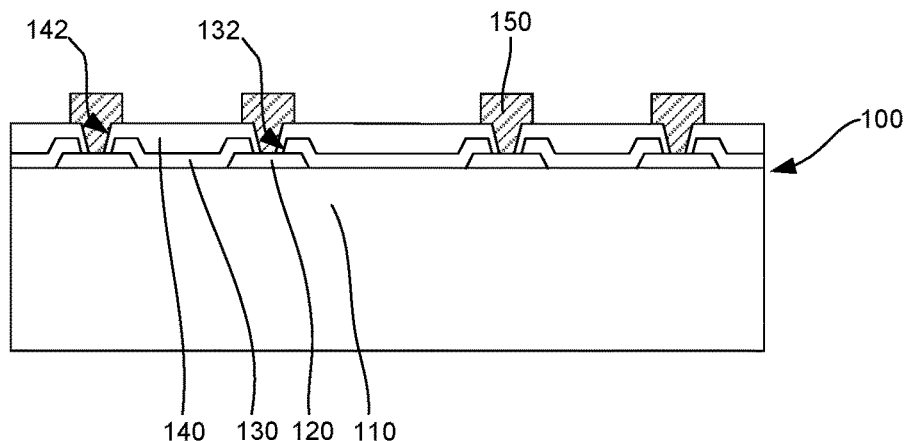

Referring to FIG. 17, a plurality of conductive pillars 150 are formed on the conductive pads 120. In some embodiments, the conductive pillars 150 are plated on the conductive pads 120. The plating process of conductive pillars 150 is described in detail as followings. First, a seed layer may be sputtered onto the post-passivation layer 140 and the conductive pads 120 revealed by the contact openings 142. A patterned photoresist layer (not shown) may be then formed over the seed layer by photolithography, wherein the patterned photoresist layer reveals portions of the seed layer that are corresponding to the conductive pads 120. The wafer 100 including the patterned photoresist layer formed thereon may be immersed into a plating solution in a plating bath such that the conductive pillars 150 are plated on the portions of the seed layer that are corresponding to the conductive pads 120. After forming the plated conductive pillars 150, the patterned photoresist layer is stripped. Thereafter, by using the conductive pillars 150 as a hard mask, portions of the seed layer that are not covered by the conductive pillars 150 may be removed through etching until the post passivation layer 140 is revealed, for example. In some embodiments, the plated conductive pillars 150 may be plated copper pillars.

Figure 18:
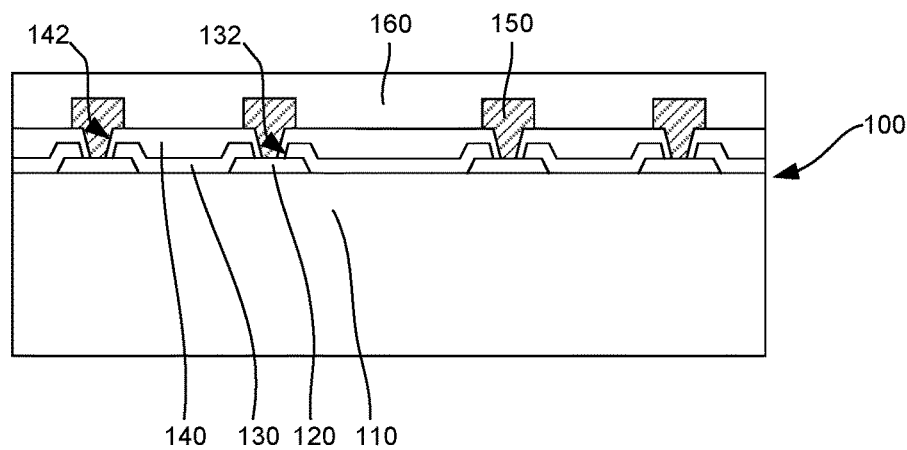

Referring to FIG. 18, after the conductive pillars 150 are formed, a protection layer 160 is formed on the post passivation layer 140 so as to cover the conductive pillars 150. In some embodiments, the protection layer 160 may be a polymer layer having sufficient thickness to encapsulate and protect the conductive pillars 150. For example, the protection layer 160 may be a polybenzoxazole (PBO) layer, a polyimide (PI) layer or other suitable polymers. In some alternative embodiments, the protection layer 160 may be made of inorganic materials.

Figure 19:
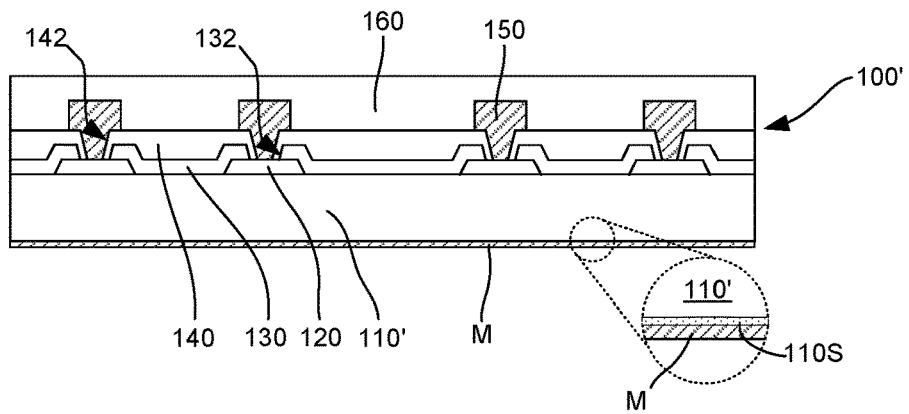

Referring to FIG. 18 and FIG. 19, a back-side grinding process is performed on the back surface of the wafer 100 after forming the protection layer 160. During the back-side grinding process, the semiconductor substrate 110 is ground such that a thinned wafer 100' including a thinned semiconductor substrate 110', the conductive pads 120 formed on the semiconductor substrate 110', the passivation layer 130, the post passivation layer 140, the conductive pillars 150 and the protection layer 160 is formed. After performing the back-side grinding process, as shown in FIG. 19, an amorphous semiconductor portion 110S (e.g., amorphous silicon layer) resulted from the back-side grinding process is formed at the back surface of the semiconductor substrate 110'. In some embodiments, the thickness of the amorphous semiconductor portion 110S may range from about 10 nanometers to about 50 nanometers.

After performing the back-side grinding process, a metallic layer M is formed on the back surface of the semiconductor substrate 110'. For example, the metallic is formed on the back surface of the semiconductor substrate 110' through sputtering or other suitable deposition process. The metallic layer M covers and is in contact with the amorphous semiconductor portion 110S of the thinned semiconductor substrate 110'. The metallic layer M serves as a protection layer to protect the amorphous semiconductor portion 110S of the thinned semiconductor substrate 110' from being damaged or removed by subsequently performed processes. The thickness of the metallic layer M may be less than about 5000 angstroms. For example, the thickness of the metallic layer M may range from about 3000 angstroms to about 5000 angstroms. In some embodiments, the metallic layer M may be a single metallic layer (e.g., copper, silver, titanium or nickel layer) or multi-layered metallic layer, and the thermal conductivity of the metallic layer M may be greater than or substantially equal to 20 W/mK. For example, the thermal conductivity of the metallic layer M may range from about 20 W/mK to about 406 W/mK.

Figure 20:
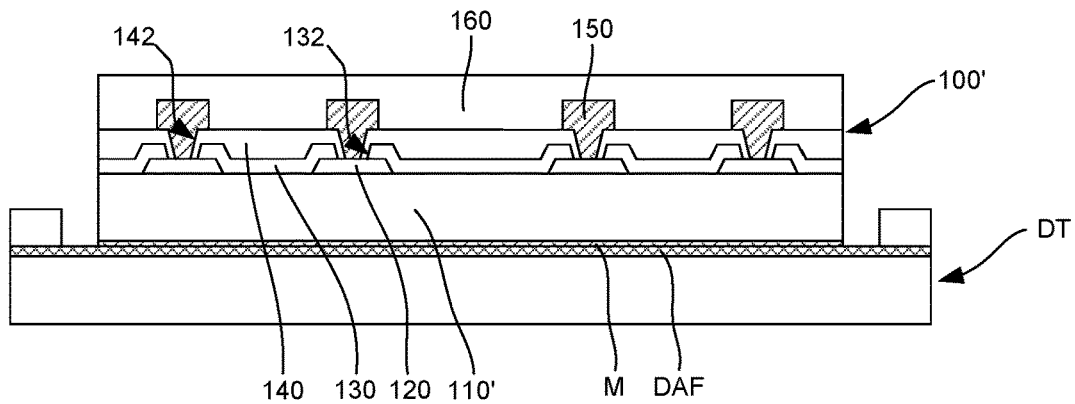

Referring to FIG. 20, after forming the metallic layer M, a dicing tape DT including a die attachment film DAF is provided and the thinned wafer 100' is mounted on the die attachment film DAF carried by the dicing tape DT such that the metallic layer M formed on the back surface of the thinned semiconductor substrate 110' is adhered with the die attachment film DAF on the dicing tape DT. In some embodiments, the dicing tape DT may support the thinned wafer 100' mounted thereon and the die attachment film DAF may temporarily adhere with the metallic layer M formed on the back surface of the thinned wafer 100'. Furthermore, the material of the die attachment film DAF may be adhesive and the thermal conductivity (k) of the die attachment film DAF is less than or substantially equal to 1 W/mK. In some embodiments, the thermal conductivity (k) of the die attachment film DAF may range from about 0.01 W/mK to about 1 W/mK.

Figure 21:
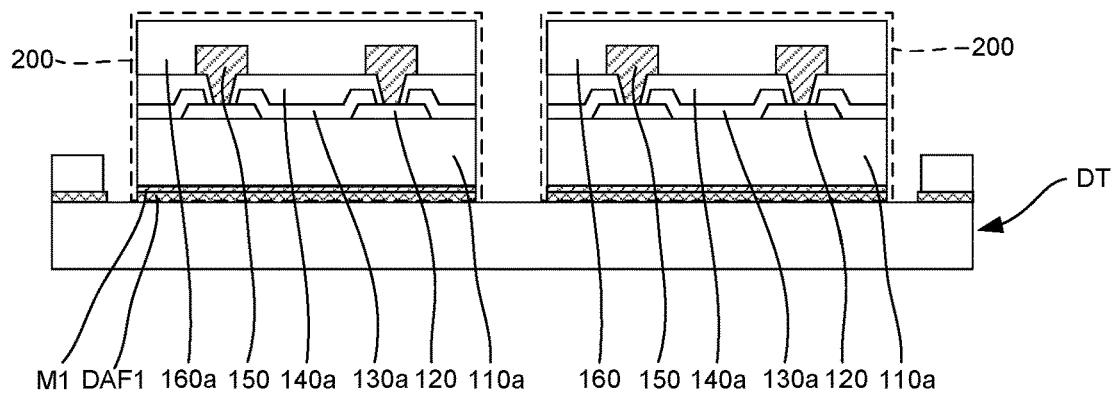

Referring to FIG. 20 and FIG. 21, after mounting the thinned wafer 100' on the dicing tape DT, a wafer dicing process is performed on the thinned wafer 100', the metallic layer M and the die attachment film DAF such that the integrated circuit components 200 in the wafer 100' are singulated from one another. After the singulation process, a plurality of singulated integrated circuit components 200, a plurality of singulated metallic layers M1 and a plurality of singulated die attachment films DAF1 are formed, wherein the singulated metallic layers M1 are between the singulated die attachment films DAF1 and the singulated integrated circuit components 200. As shown in FIG. 21, each of the singulated integrated circuit components 200 includes a semiconductor substrate 110a, the conductive pads 120 formed on the semiconductor substrate 110a, a passivation layer 130a, a post passivation layer 140a, the conductive pillars 150, and a protection layer 160a. The singulated metallic layers M1 cover the back surface of the semiconductor substrates 110a and the singulated die attachment film DAF1 are adhered with the singulated metallic layers M1. The materials and the characteristics of the semiconductor substrate 110a, the passivation layer 130a, the post passivation layer 140a, and the protection layer 160a are the same as those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a in the singulated integrated circuit components 200 are omitted.

During the back-side grinding and the wafer dicing processes, the protection layer 160 may well protect the conductive pillars 150 of the singulated integrated circuit components 200. In addition, the conductive pillars 150 of the singulated integrated circuit components 200 may be protected from being damaged by subsequently performed processes, such as the picking-up and placing process of the singulated integrated circuit components 200, the molding process, and so on.

Figure 22:
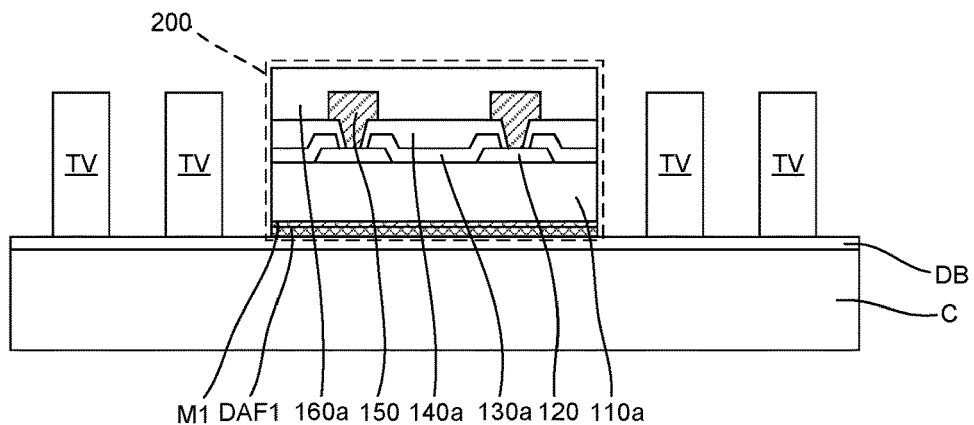

Referring to FIG. 21 and FIG. 22, a carrier C having a de-bonding layer DB formed thereon is provided. In some embodiments, the carrier C is a glass substrate and the de-bonding layer DB is a light-to-heat conversion (LTHC) release layer formed on the glass substrate. In some alternative embodiments, a dielectric layer (not shown) may be formed on the de-bonding layer DB such that the de-bonding layer DB is between the carrier C and the dielectric layer. The dielectric layer is a polybenzoxazole (PBO) layer formed on the de-bonding layer DB, for example.

After the carrier C having the de-bonding layer DB formed thereon is provided, a plurality of conductive through vias TV are formed on the de-bonding layer DB. In some embodiments, the plurality of conductive through vias TV may be formed by sputtering of a seed layer, photoresist coating, photolithography, plating of through vias, photoresist stripping and patterning of the seed layer. For example, the conductive through vias TV include copper posts or other suitable metal posts.

As shown in FIG. 21 and FIG. 22, in some embodiments, one of the singulated integrated circuit components 200 is picked-up from the dicing tape DT and placed on the de-bonding layer DB such that the die attachment film DAF. In some alternative embodiments, more than one of the singulated integrated circuit components 200 are picked-up from the dicing tape DT and placed on the de-bonding layer DB, wherein the singulated integrated circuit components 200 placed on the de-bonding layer DB may be arranged in an array. When the singulated integrated circuit components 200 placed on the de-bonding layer DB are arranged in an array, the conductive through vias TV may be classified into groups and the number of the singulated integrated circuit components 200 is corresponding to the number of the groups of the conductive through vias TV.

The singulated integrated circuit components 200 is attached or adhered on the de-bonding layer DB through the singulated die attachment film DAF1, wherein the thermal conductivity (k) of the singulated die attachment film DAF1 is less than or substantially equal to 1 W/mK. In some embodiments, the thermal conductivity (k) of the singulated die attachment film DAF1 may range from about 0.01 W/mK to about 1 W/mK. In addition, the material of the singulated die attachment film DAF1 may be adhesive.

As shown in FIG. 22, the top surface of the protection layer 160a is higher than the top surfaces of the conductive through vias TV while the top surface of the protection layer 160a is higher than the top surfaces of the conductive pillars 150, for example. However, the disclosure is not limited thereto. In some alternative embodiments, the top surface of the protection layer 160a may be substantially aligned with the top surfaces of the conductive through vias TV, and the top surface of the protection layer 160a is higher than the top surfaces of the conductive pillars 150.

Figure 23:
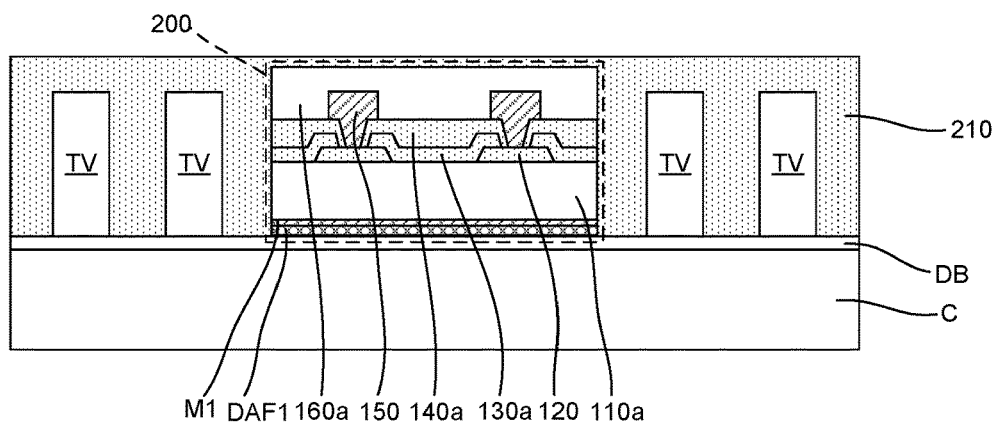

Referring to FIG. 23, an insulating material 210 is formed on the de-bonding layer DB to cover the singulated integrated circuit component 200 and the conductive through vias TV. In some embodiments, the insulating material 210 is a molding compound formed by a molding process. The top surface of the protection layer 160a of the singulated integrated circuit component 200 are covered by the insulating material 210, for example. In other words, the top surface of the protection layer 160a of the singulated integrated circuit component 200 are not revealed and are protected by the insulating material 210. In some embodiments, the insulating material 210 includes epoxy or other suitable dielectric materials.

Figure 24:
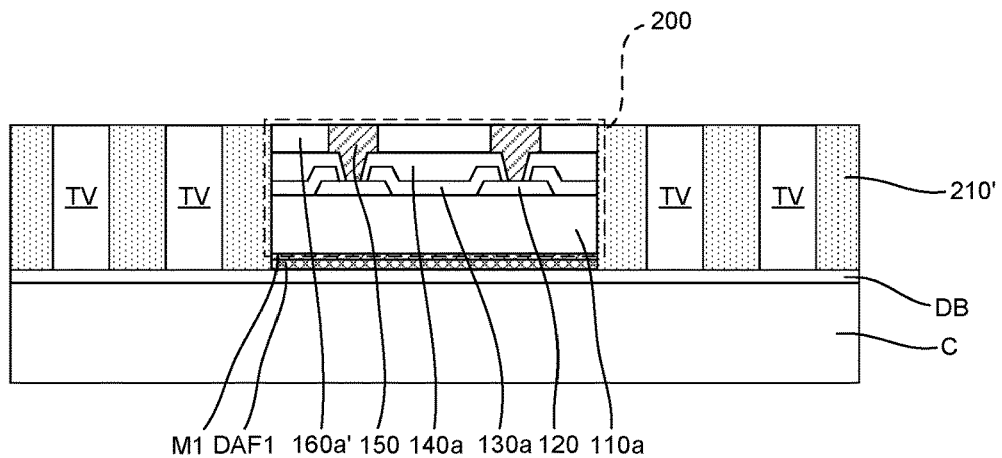

Referring to FIG. 23 and FIG. 24, the insulating material 210 is ground until the top surfaces of the conductive pillars 150, the top surfaces of the conductive through vias TV and the top surface of the protection layer 160a are revealed. In some embodiments, the insulating material 210 is ground by a mechanical grinding process and/or a chemical mechanical polishing (CMP) process. After the insulating material 210 is ground, an insulating encapsulation 210' is formed. During the grinding process of the insulating material 210, portions of the protection layer 160a are ground to form a protection layer 160a'. In some embodiments, during the grinding process of the insulating material 210 and the protection layer 160a, portions of the conductive through vias TV and portions of the conductive pillars 150 are slightly ground also.

As shown in FIG. 24, the insulating encapsulation 210' laterally encapsulates the sidewalls of the singulated integrated circuit component 200, and the insulating encapsulation 210' is penetrated by the conductive through vias TV. In other words, the singulated integrated circuit component 200 and the conductive through vias TV are embedded in the insulating encapsulation 210'. It is noted that the top surfaces of the conductive through vias TV, the top surface of the insulating encapsulation 210', the top surfaces of the conductive pillars 150 and the top surface of the protection layer 160a' are substantially at the same level.

Figure 25:
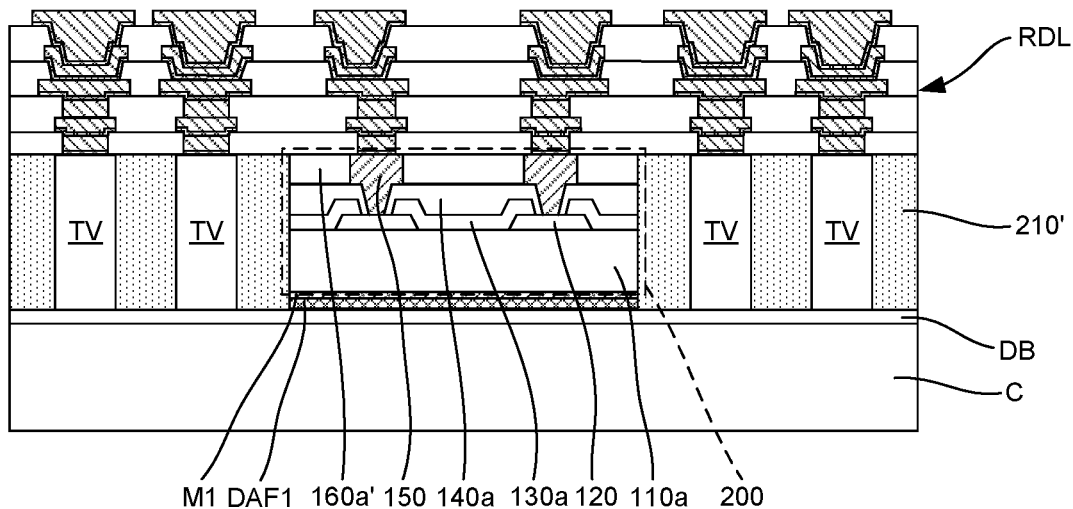

Referring to FIG. 25, after forming the insulating encapsulation 210' and the protection layer 160a', a redistribution circuit structure RDL is formed on the top surfaces of the conductive through vias TV, the top surface of the insulating encapsulation 210', the top surfaces of the conductive pillars 150 and the top surface of the protection layer 160a'. The redistribution circuit structure RDL is fabricated to electrically connect with one or more connectors underneath. Here, the afore-said connectors may be the conductive pillars 150 of the singulated integrated circuit component 200 and/or the conductive through vias TV embedded in the insulating encapsulation 210'. The redistribution circuit structure RDL may include a plurality of redistribution wirings and a plurality of patterned dielectric layers stacked alternately, as shown in FIG. 25. For example, the redistribution wirings may be copper wirings and the material of the patterned dielectric layers may include polyimide (PI), polybenzoxazole (PBO) or other suitable dielectric polymer. Furthermore, the conductive through vias TV are electrically connected to the singulated integrated circuit component 200 through the redistribution circuit structure RDL.

Figure 26:
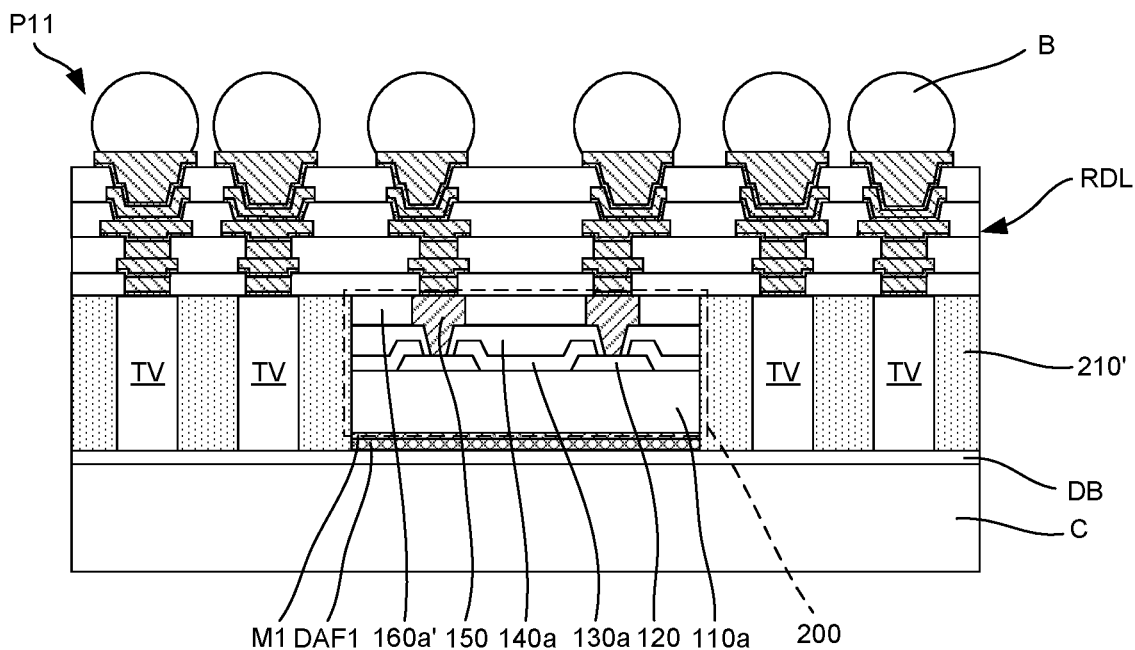

Referring to FIG. 26, after forming the redistribution circuit structure RDL, a plurality of conductive features B electrically connected to the redistribution circuit structure RDL are formed. The conductive features B are disposed on the redistribution circuit structure RDL and are arranged in array. In some embodiments, the conductive features B may be conductive balls (e.g., solder balls) arranged in array. As shown in FIG. 26, a package structure P11 including the singulated metallic layer M1, the singulated die attachment film DAF1, the singulated integrated circuit component 200, the conductive through vias TV, the insulating encapsulation 210', the redistribution circuit structure RDL and the conductive features B is fabricated on the de-bonding layer DB carried by the carrier C.

Figure 27:
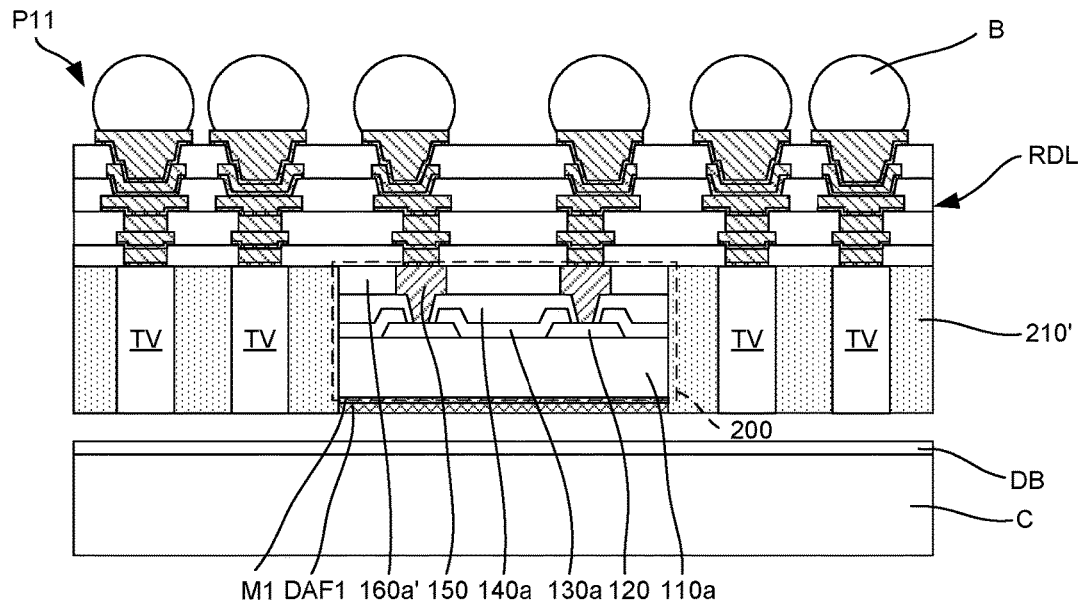

Referring to FIG. 27, the de-bonding layer DB and the carrier C is be-bonded from the package structure P11 such that the bottom surfaces of the conductive through vias TV, the bottom surface of the insulating encapsulation 210' and a surface of the singulated die attachment film DAF1 are de-bonded from the carrier C and are revealed. The bottom surface of the insulating encapsulation 210' and the revealed surface of the singulated die attachment film DAF1, are substantially at the same level. In some embodiments, the external energy such as UV laser, visible light or heat, may be applied to the de-bonding layer DB such that the package structure P11 and the de-bonding layer DB carried by the carrier C can be separated.

Figure 28:
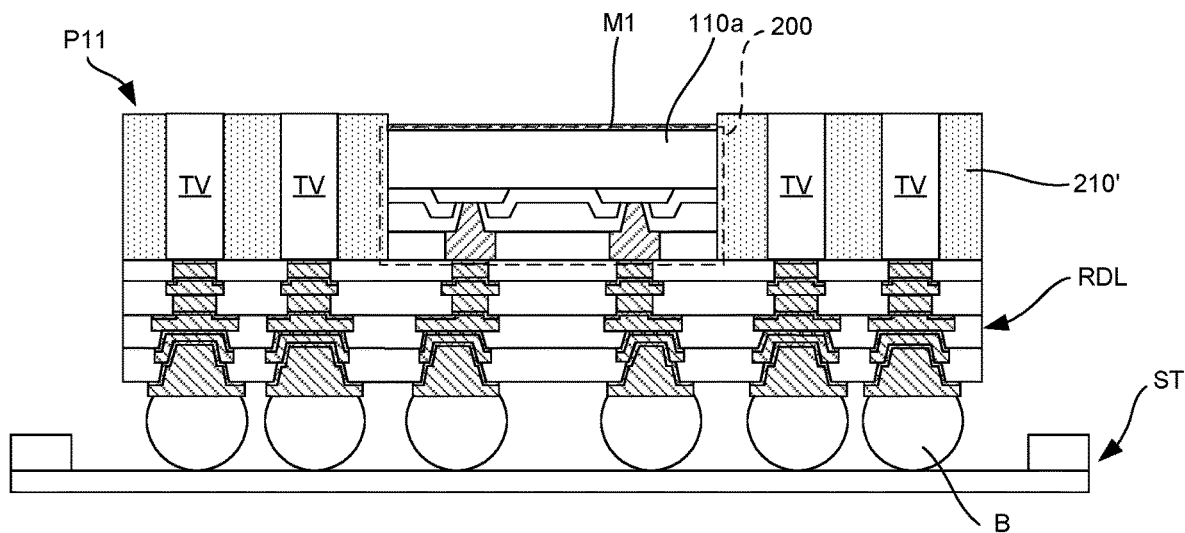

Referring to FIG. 28, after performing the de-bonding process, the package structure P11 may be flipped (turned upside down) and mounted onto a saw tape ST such that the conductive features B of the package structure P1 are adhered with the saw tape ST. In some embodiments, the saw tape ST may support the above-mentioned package structure P11 mounted thereon and temporarily adhere with the conductive features B of the package structure P11. Since the thermal conductivity (k) of the singulated die attachment film DAF1 is low (i.e. less than or substantially equal to 1 W/mK), the singulated die attachment film DAF1 may not effectively conduct and dissipate the heat generated from the singulated integrated circuit components 200. Accordingly, the singulated die attachment film DAF1 may be removed until the singulated metallic layer M1 is revealed so as to enhance the heat dissipation performance of the package structure P11. For example, the singulated die attachment film DAF1 may be removed by dry etch (e.g., plasma treatment) or other suitable removal processes. When removing the singulated die attachment film DAF1, the singulated metallic layer M1 may protect the amorphous semiconductor portion 110S (shown in FIG. 29) of the thinned semiconductor substrate 110' from being damaged or removed.

Figure 29:
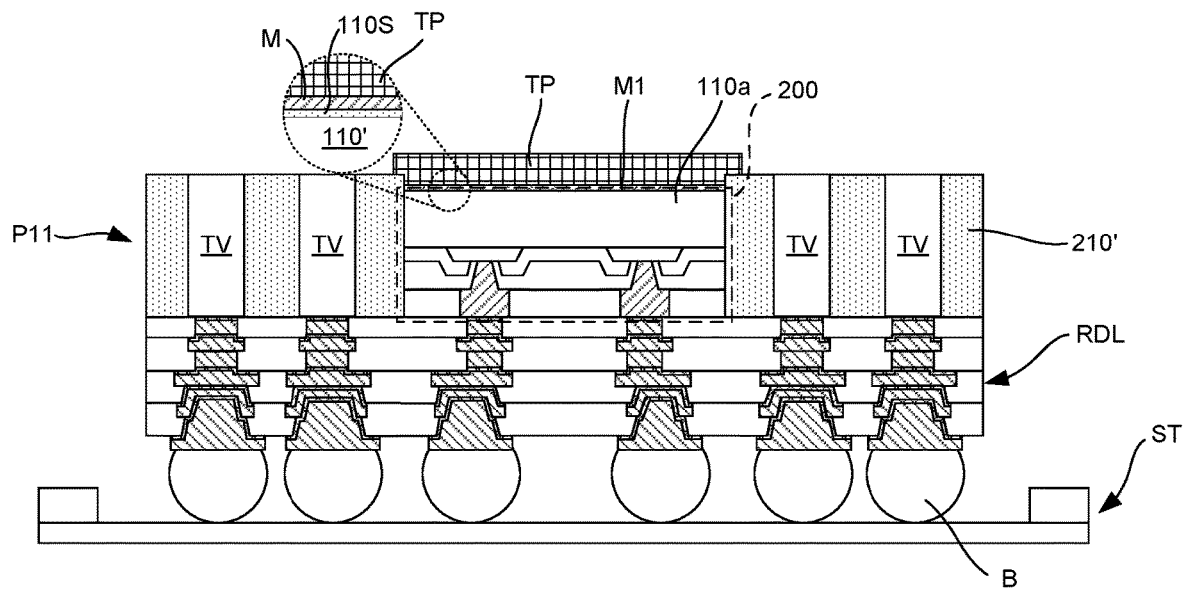

Referring to FIG. 29, after removing the singulated die attachment film DAF1, a thermal paste TP may be formed through dispensing or other suitable processes so as to cover the revealed surface of the singulated metallic layer M1, wherein the thermal conductivity (k) of the thermal paste TP is greater than or substantially equal to 10 W/mK. For example, the thermal conductivity (k) of the thermal paste TP ranges from about 10 W/mK to about 250 W/mK. In some embodiments, the thermal conductivity (k) of the thermal paste TP may be less than the thermal conductivity (k) of the singulated metallic layer M1. In some alternative embodiments, the thermal conductivity (k) of the thermal paste TP may be greater than or substantially equal to the thermal conductivity (k) of the singulated metallic layer M1. Since the thermal conductivity (k) of both the thermal paste TP and the singulated metallic layer M1 is high (i.e. greater than or substantially equal to 10 W/mK), the thermal paste TP and the singulated metallic layer M1 can effectively conduct and dissipate the heat generated from the singulated integrated circuit components 200.

As shown in FIG. 29, the singulated metallic layer M1 is embedded in the insulating encapsulation 210' and is in contact with the amorphous semiconductor portion 110S of the thinned semiconductor substrate 110'. Furthermore, the thermal paste TP covers the singulated metallic layer M1 and the thermal paste TP is partially embedded in the insulating encapsulant 210'. In some embodiments, the thermal paste TP may be thicker than the singulated metallic layer M1. For example, the thickness of the thermal paste TP may range from about 1 micrometer to about 100 micrometers. In some alternative embodiments, the thermal paste TP may be thinner than the singulated metallic layer M1. In some other embodiments, the thermal paste TP and the singulated metallic layer M1 may be substantial identical in thickness. Furthermore, the thermal paste TP may not only cover the surface of the singulated metallic layer M1, but also may partially cover the surface of the insulating encapsulation 210'. However, the distribution of the thermal paste TP is not limited thereto.

When the thermal paste TP contains metallic particles (e.g., copper particles), the singulated metallic layer M1 may serve as a diffusion barrier for metallic particles. Furthermore, the amorphous semiconductor portion 110S of the thinned semiconductor substrate 110' may trap the metallic particles from the singulated metallic layer M1 and may serve as a diffusion barrier for metallic particles diffused from the singulated metallic layer M1. Accordingly, the package structure P11 may easily qualify the high temperature operating life (HTOL) test.

Figure 32:
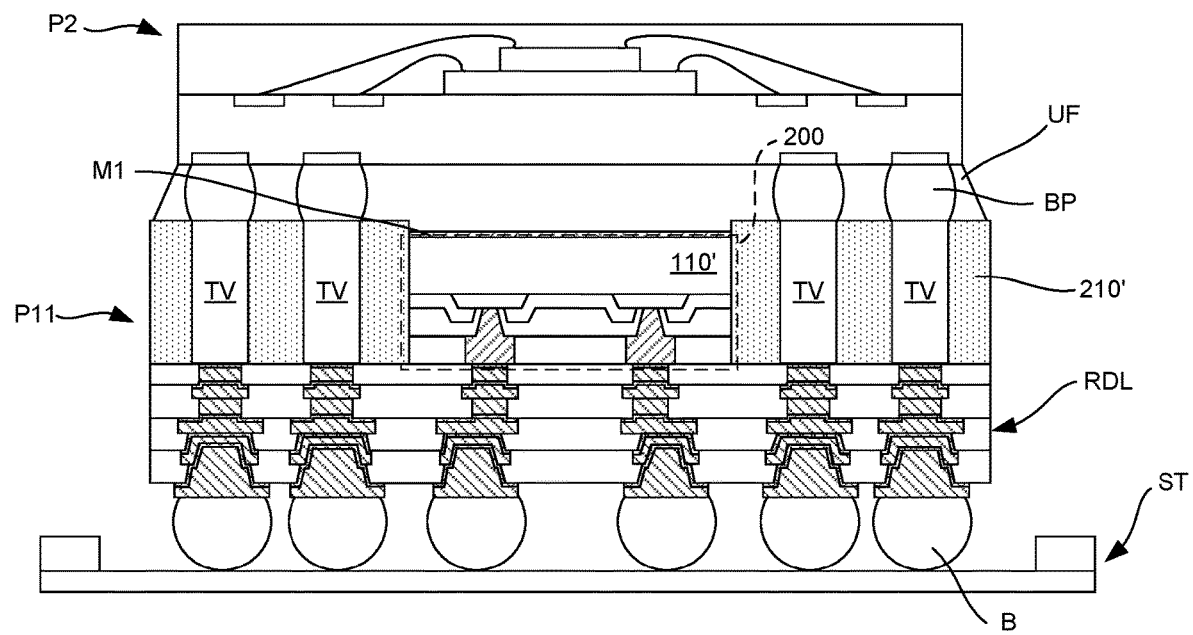
FIG. 32 schematically illustrates an integrated fan-out package in accordance with some alternative embodiments of the present disclosure.

In some alternative embodiments, the fabrication of the thermal paste TP may be omitted, as shown in FIG. 32.

As shown in FIG. 29, the combination of the singulated metallic layer M1 and the thermal paste TP may be considered as a thermal conductive layer which covers the amorphous semiconductor portion 110S of the singulated integrated circuit component 200. In some alternative embodiments, the thermal conductive layer includes the singulated metallic layer M1 only when the fabrication of the thermal paste TP is omitted.

Figure 30:
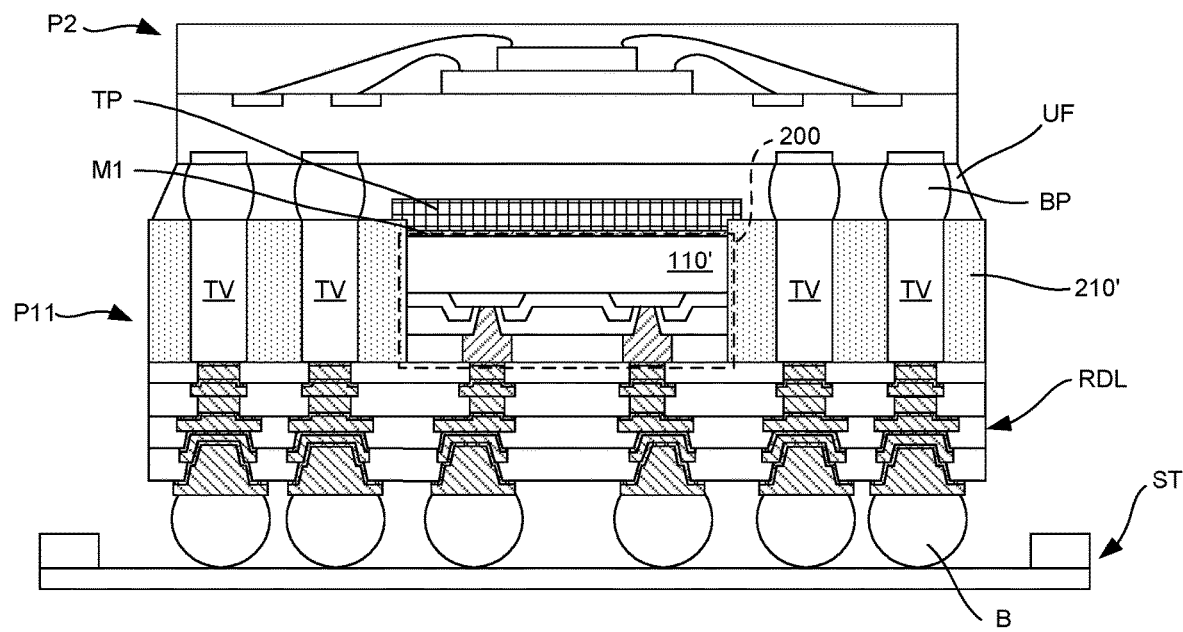

Referring to FIG. 30, a semiconductor device P2 is provided and is placed on the package structure P11 so as to electrically connect the semiconductor device P2 to the conductive through vias TV. The semiconductor device P2 is electrically connected to the singulated integrated circuit component 200 through the conductive through vias TV and the redistribution circuit structure RDL. In some embodiments, the semiconductor device P2 may be electrically connected to the conductive through vias TV of the package structure P11 through a plurality of conductive bumps BP. For example, the conductive bumps BP may be microbumps, controlled collapse chip connection (C4) bumps or the like.

In some embodiments, the semiconductor device P2 may be a memory device (e.g., DRAM) including the conductive bumps BP on the bottom surface thereof. Before mounting the memory device on to the package structure P11, solder material may be applied onto the conductive through vias TV of the package structure P11 through, for example, a stencil printing process, and then the semiconductor device P2 including the conductive bumps BP is placed on the conductive through vias TV. Thereafter, a reflow process is performed to form solder joints between the semiconductor device P2 and the conductive through vias TV of the package structure P11.

After performing the above-mentioned reflow process, an underfill UF is formed between the package structure P11 and the semiconductor device P2 to encapsulate the thermal paste TP and the conductive bumps BP. In some embodiments, the material of the underfill UF may include epoxy resin containing filler and the thermal conductivity of the underfill UF may be less than about 1 W/mK. The underfill UF laterally encapsulates the conductive bumps BP and serves as stress buffer to minimize fatigue of the conductive bumps BP due to coefficient of thermal expansion (CTE) mismatch between the package structure P11 and the semiconductor device P2.

After forming the underfill UF, a sawing process is performed on the package structure P11 to form a plurality of singulated package-on-package (PoP) structures. After performing the sawing process of the package structure P11, the singulated package-on-package (PoP) structures are adhered with the saw tape ST. Furthermore, the underfill UF may ensure the reliability of the package-on-package (PoP) structure including the package structure P11 and the semiconductor device P2.

In accordance with some embodiments of the disclosure, a method of fabricating a chip package including the following steps is provided. An integrated circuit component is attached on a carrier through a first thermal paste, wherein thermal conductivity of the first thermal paste ranges from about 10 W/mK to about 250 W/mK. An insulating encapsulant is formed to encapsulate the integrated circuit component attached on the carrier. A redistribution circuit structure is formed on the insulating encapsulant and the integrated circuit component, wherein the redistribution circuit structure is electrically connected to the integrated circuit component.

In accordance with some embodiments of the disclosure, a method of fabricating a chip package including the following steps is provided. An integrated circuit component with a metallic layer formed thereon is provided. The integrated circuit component is attached on a carrier through a die attachment film such that the metallic layer is between the integrated circuit component and the die attachment film, wherein thermal conductivity of the metallic layer is greater than thermal conductivity of the die attachment film. An insulating encapsulant is formed to encapsulate the integrated circuit component attached on the carrier. A redistribution circuit structure is formed on the insulating encapsulant and the integrated circuit component, wherein the redistribution circuit structure is electrically connected to the integrated circuit component.

In accordance with some embodiments of the disclosure, a chip package including an integrated circuit component, a thermal conductive layer, an insulating encapsulant and a redistribution circuit structure is provided. The integrated circuit component includes an amorphous semiconductor portion located at a back surface thereof. The thermal conductive layer covers the amorphous semiconductor portion of the integrated circuit component, wherein thermal conductivity of the thermal conductive layer ranges from about 10 W/mK to about 250 W/mK. The insulating encapsulant encapsulates the integrated circuit component and the thermal conductive layer. The redistribution circuit structure is disposed on the insulating encapsulant and the integrated circuit component, wherein the redistribution circuit structure is electrically connected to the integrated circuit component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
an integrated circuit component comprising an amorphous semiconductor portion located at a back surface thereof;
a thermal conductive layer covering the amorphous semiconductor portion of the integrated circuit component, wherein the thermal conductive layer comprises: a first thermal paste in contact with the amorphous semiconductor portion of the integrated circuit component; and a second thermal paste covering the first thermal paste;
an insulating encapsulant encapsulating the integrated circuit component and the thermal conductive layer; and
a redistribution circuit structure disposed on the insulating encapsulant and the integrated circuit component, wherein the redistribution circuit structure is electrically connected to the integrated circuit component.

2. The chip package as claimed in claim 1, wherein the thermal conductive layer comprises a first thermal paste in contact with the amorphous semiconductor portion of the integrated circuit component.

3. The chip package as claimed in claim 1, wherein a thermal conductivity of the first thermal paste ranges from about 10 W/mK to about 250 W/mK; and
a thermal conductivity of the second thermal paste ranges from about 10 W/mK to about 250 W/mK.

4. The chip package as claimed in claim 1, wherein the thermal conductive layer comprises a metallic layer in contact with the amorphous semiconductor portion of the integrated circuit component, and a thermal conductivity of the metallic layer ranges from about 20 W/mK to about 406 W/mK.

5. The chip package as claimed in claim 1, wherein the thermal conductive layer comprises:
a metallic layer in contact with the amorphous semiconductor portion of the integrated circuit component; and
a thermal paste covering the metallic layer, wherein the thermal paste is partially embedded in the insulating encapsulant.

6. The chip package as claimed in claim 5, wherein an interface between the metallic layer and the thermal paste is lower than the first surface of the insulating encapsulant.

7. A chip package, comprising:
an integrated circuit component;
a first thermal conductive layer covering a back surface of the integrated circuit component;
an insulating encapsulant laterally encapsulating the integrated circuit component and the first thermal conductive layer, the insulating encapsulant comprising a first surface and a second surface opposite to the first surface;
a second thermal conductive layer covering the first thermal conductive layer and portions of the insulating encapsulant, wherein an interface between the first thermal conductive layer and the second thermal conductive layer is lower than the first surface of the insulating encapsulant; and
a redistribution circuit structure disposed on the second surface of the insulating encapsulant and a front surface of the integrated circuit component, wherein the redistribution circuit structure is electrically connected to the integrated circuit component.

8. The chip package as claimed in claim 7, wherein a thermal conductivity of the first thermal conductive layer ranges from about 10 W/mK to about 250 W/mK.

9. The chip package as claimed in claim 7, wherein the second thermal conductive layer comprises a bottom surface and a top surface opposite to the bottom surface, the bottom surface is in contact with the first thermal conductive layer, and the top surface of the second thermal conductive layer is higher than the first surface of the insulating encapsulant.

10. The chip package as claimed in claim 7, wherein the first thermal conductive layer has a thermal conductivity ranging from about 10 W/mK to about 250 W/mK.

11. The chip package as claimed in claim 7, wherein the second thermal conductive layer has a thermal conductivity ranging from about 10 W/mK to about 250 W/mK.

12. The chip package as claimed in claim 7, wherein the first thermal conductive layer comprises a metallic layer in contact with the back surface of the integrated circuit component, and a thermal conductivity of the metallic layer ranges from about 20 W/mK to about 406 W/mK.

13. The chip package as claimed in claim 7 further comprising:
a semiconductor device disposed over the integrated circuit component and the insulating encapsulant, wherein the semiconductor device is electrically connected to the integrated circuit component;

conductive through vias penetrating through the insulating encapsulant; and conductive bumps disposed between the semiconductor device and the conductive through vias, wherein the semiconductor device is electrically connected to the integrated circuit component through the bumps, the conductive through vias and the redistribution circuit structure.

14. The chip package as claimed in claim 13 further comprising an underfill laterally encapsulating the conductive bumps, wherein portions of sidewalls of the second thermal conductive layer and a top surface is in contact with the underfill.

15. The chip package as claimed in claim 14, wherein the first thermal conductive layer and the underfill are spaced apart from each other by the second thermal conductive layer.

16. A chip package, comprising:
an integrated circuit component;
a metallic layer;
an insulating encapsulant laterally encapsulating the integrated circuit component and the metallic layer;
a redistribution circuit structure disposed on the second surface of the insulating encapsulant and a front surface of the integrated circuit component, wherein the redistribution circuit structure is electrically connected to the integrated circuit component;
a semiconductor device disposed over the integrated circuit component and the insulating encapsulant, wherein the semiconductor device is electrically connected to the integrated circuit component;
conductive through vias penetrating through the insulating encapsulant; and conductive bumps disposed between the semiconductor device and the conductive through vias, wherein the semiconductor device is electrically connected to the integrated circuit component through the conductive bumps, the conductive through vias and the redistribution circuit structure.

17. The chip package as claimed in claim 16, wherein a thermal conductivity of the metallic layer ranges from about 20 W/mK to about 406 W/mK.

18. The chip package as claimed in claim 16, wherein the metallic layer comprises a bottom surface and a top surface opposite to the bottom surface, the bottom surface being in contact with a back surface of the integrated circuit component, the insulating encapsulant comprises a first surface and a second surface opposite to the first surface, and the top surface or the metallic layer is lower than the first surface of the insulating encapsulant.

19. The chip package as claimed in claim 17 further comprising an underfill laterally encapsulating the conductive bumps, wherein the underfill is in contact with the top surface of the metallic layer.

20. The chip package as claimed in claim 17, wherein a first shortest distance between the metallic layer and the semiconductor device is greater than a second shortest distance between the insulating encapsulant and the semiconductor device.

* * * * *